(12) United States Patent
Awano

(10) Patent No.: US 11,576,290 B2
(45) Date of Patent: Feb. 7, 2023

(54) COMPONENT SUPPLY DEVICE AND COMPONENT MOUNTING DEVICE

(71) Applicant: YAMAHA HATSUDOKI KABUSHIKI KAISHA, Iwata (JP)

(72) Inventor: Yukinari Awano, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 318 days.

(21) Appl. No.: 16/754,624

(22) PCT Filed: Oct. 31, 2017

(86) PCT No.: PCT/JP2017/039223
§ 371 (c)(1),
(2) Date: Apr. 8, 2020

(87) PCT Pub. No.: WO2019/087270
PCT Pub. Date: May 9, 2019

(65) Prior Publication Data
US 2020/0315076 A1    Oct. 1, 2020

(51) Int. Cl.
*H05K 13/02* (2006.01)
*H05K 13/04* (2006.01)
*H05K 13/08* (2006.01)

(52) U.S. Cl.
CPC ......... *H05K 13/022* (2013.01); *H05K 13/021* (2013.01); *H05K 13/0419* (2018.08); *H05K 13/043* (2013.01); *H05K 13/086* (2018.08)

(58) Field of Classification Search
CPC ............... H05K 13/021; H05K 13/022; H05K 13/0419; H05K 13/043; H05K 13/086
See application file for complete search history.

(56) References Cited

U.S. PATENT DOCUMENTS

| | | | |
|---|---|---|---|
| 6,162,007 A * | 12/2000 | Witte | B65H 20/22 221/72 |
| 6,652,706 B1 | 11/2003 | MacNeil et al. | |
| 9,415,968 B2 * | 8/2016 | Higuchi | H05K 13/0419 |
| 11,291,148 B2 * | 3/2022 | Awano | H05K 13/046 |
| 2020/0315076 A1 * | 10/2020 | Awano | H05K 13/0419 |

FOREIGN PATENT DOCUMENTS

| | | |
|---|---|---|
| CN | 102783266 A | 11/2012 |
| CN | 104904331 A | 9/2015 |
| JP | H0681987 U | 11/1994 |

(Continued)

OTHER PUBLICATIONS

An Office Action issued by the China National Intellectual Property Administration dated Sep. 15, 2020, which corresponds to Chinese U.S. Appl. No. 16/754,624.1 and is related to U.S. Appl. No. 16/754,624 with English language translation.

(Continued)

*Primary Examiner* — Minh N Trinh
(74) *Attorney, Agent, or Firm* — Studebaker & Brackett PC

(57) ABSTRACT

A component supply device includes a tape feeder configured to feed a tape including a storage configured to store a component and a cover tape configured to cover an upper side of the storage, and a press including a columnar protrusion configured to press an upper surface of a portion of the cover tape that covers the storage.

20 Claims, 6 Drawing Sheets

(56) References Cited

FOREIGN PATENT DOCUMENTS

| JP | H07326887 | A | 12/1995 |
| JP | 2004022865 | A | 1/2004 |
| JP | 2008098499 | A | 4/2008 |
| JP | 5372661 | B2 | 12/2013 |
| JP | 2015019047 | A | 1/2015 |
| JP | 6000792 | B2 | 10/2016 |

OTHER PUBLICATIONS

International Search Report issued in PCT/JP2017/039223; dated Dec. 12, 2017.
Written Opinion issued in PCT/JP2017/039223; dated Dec. 12, 2017.

* cited by examiner

COMPONENT SUPPLY DEVICE AND COMPONENT MOUNTING DEVICE

CROSS-REFERENCE TO RELATED APPLICATION

This application is a National Stage of International Patent Application No. PCT/JP2017/039223, filed Oct. 31, 2017, the entire content of which is incorporated herein by reference.

BACKGROUND

Technical Field

The present disclosure relates to a component supply device and a component mounting device.

Background Art

Conventionally, a component supply device is known. A component supply device is disclosed in Japanese Patent No. 5372661, for example.

Japanese Patent No. 5372661 discloses an electronic component feeder (component supply device) including a conveyance portion configured to feed a component tape including storages in which the components are stored, and a vibrator configured to adjust the positions of the components stored in the storages by vibration. This electronic component feeder is configured to move the components to predetermined positions in the storages by acceleration and deceleration of the component tape by the conveyance portion and vibration by the vibrator.

SUMMARY

However, in the electronic component feeder (component supply device) disclosed in Japanese Patent No. 5372661, when the components adhere to a cover tape that covers the storages, covering with the cover tape is released such that the components that have adhered to the cover tape may disadvantageously jump out of the storages, and a member configured to release covering with the cover tape may disadvantageously contact the components. Therefore, there is a problem that it is difficult to reliably supply the components.

Accordingly, the present disclosure provides a component supply device and a component mounting device each capable of reliably supplying components while significantly reducing or preventing adhesion of the components to the cover tape.

A component supply device according to a first aspect of the present disclosure includes a tape feeder configured to feed a tape including a storage configured to store a component and a cover tape configured to cover an upper side of the storage, and a press including a columnar protrusion configured to press an upper surface of a portion of the cover tape that covers the storage.

The component supply device according to the first aspect of the present disclosure is configuring as described above such that even when the component adheres to the cover tape, the cover tape is pressed from above by the protrusion such that the component can be separated from the cover tape and stored in the storage. Consequently, when covering with the cover tape is released, it is possible to significantly reduce or prevent component jumping out of the storage and contact between a member configured to release covering with the cover tape and the component. Thus, the component can be reliably supplied while adhesion of the component to the cover tape is significantly reduced or prevented.

In the aforementioned component supply device according to the first aspect, the columnar protrusion preferably has a size in each of a first direction in which the tape is fed and a second direction, which is orthogonal to the first direction and is horizontal, the size being smaller than a size of the storage in a corresponding direction. According to this structure, the protrusion can be inserted into the storage via the cover tape, and thus the cover tape can be deformed in a concave shape toward the bottom surface of the storage by the protrusion. Thus, when the component adheres to the cover tape, the component that has adhered can be easily separated from the cover tape.

In this case, the columnar protrusion preferably has a size in at least one of the first direction or the second direction, the size being less than half the size of the storage in the corresponding direction. According to this structure, the protrusion can be easily inserted into the storage via the cover tape, and thus the cover tape can be easily deformed in a concave shape toward the bottom surface of the storage by the protrusion.

The aforementioned component supply device according to the first aspect preferably further includes an opener configured to release covering with the cover tape and open the upper side of the storage, and the press is preferably arranged upstream of the opener in a direction in which the tape is fed. According to this structure, the component that has adhered to the cover tape can be separated upstream of a position at which covering with the cover tape is released by the opener, and thus interference between the opener and the component can be effectively significantly reduced or prevented.

In the aforementioned component supply device according to the first aspect, the press is preferably arranged upstream of a component extraction position, at which the component is extracted from the storage, in a direction in which the tape is fed. According to this structure, the component can be reliably stored in the storage upstream of the component extraction position, and thus the component can be more reliably supplied.

The aforementioned component supply device according to the first aspect preferably further includes a roller configured to contact the cover tape from above and rotate along a direction in which the tape is fed, the press preferably includes a plurality of protrusions, and the plurality of protrusions are preferably circumferentially arranged on an outer periphery of the roller. According to this structure, the resistance to tape feeding caused by pressing of the press against the cover tape can be reduced by rotation of the roller, and thus the tape can be fed smoothly.

In this case, the plurality of protrusions are preferably circumferentially arranged on the outer periphery of the roller at an interval that is equal to or less than a minimum pitch for feeding the tape by the tape feeder. According to this structure, the interval between the plurality of protrusions can be reduced, and thus the protrusions can be applied with high probability to a portion of the cover tape corresponding to the storage.

In the aforementioned structure including the roller, the plurality of protrusions are preferably circumferentially spaced apart on the outer periphery of the roller such that a value obtained by multiplying an interval between adjacent protrusions by an integer does not match a minimum pitch value for feeding the tape by the tape feeder. According to this structure, a cycle of an interval between storages and a cycle of the interval between the plurality of protrusions can be shifted from each other, and thus even when one protrusion misses the storage, another protrusion can be aligned with the storage. Thus, the protrusions can be applied with higher probability to the portion of the cover tape corresponding to the storage.

In the aforementioned component supply device according to the first aspect, the columnar protrusion is preferably tapered. According to this structure, the mechanical strength of a base portion of the protrusion can be increased, and the tip of the protrusion can be more easily inserted into the storage via the cover tape.

The aforementioned component supply device according to the first aspect preferably further includes an urging member configured to urge the protrusion toward the cover tape. According to this structure, the protrusion can be easily pressed against the cover tape.

A component mounting device according to a second aspect of the present disclosure includes a component supply device, and a mounting head configured to mount, on a substrate, a component supplied from the component supply device. The component supply device includes a tape feeder configured to feed a tape including a storage configured to store the component and a cover tape configured to cover an upper side of the storage, and a press including a columnar protrusion configured to press an upper surface of a portion of the cover tape that covers the storage.

The component mounting device according to the second aspect of the present disclosure is configured as described above such that it is possible to provide the component mounting device capable of reliably supplying the component while significantly reducing or preventing adhesion of the component to the cover tape.

According to the present disclosure, as described above, it is possible to reliably supply the components while significantly reducing or preventing adhesion of the components to the cover tape.

DETAILED DESCRIPTION

An embodiment embodying the present disclosure is hereinafter described on the basis of the drawings.

(Structure of Component Mounting Device)

The structure of a component mounting device 100 according to the embodiment of the present disclosure is now described with reference to FIG. 1.

Figure 1:
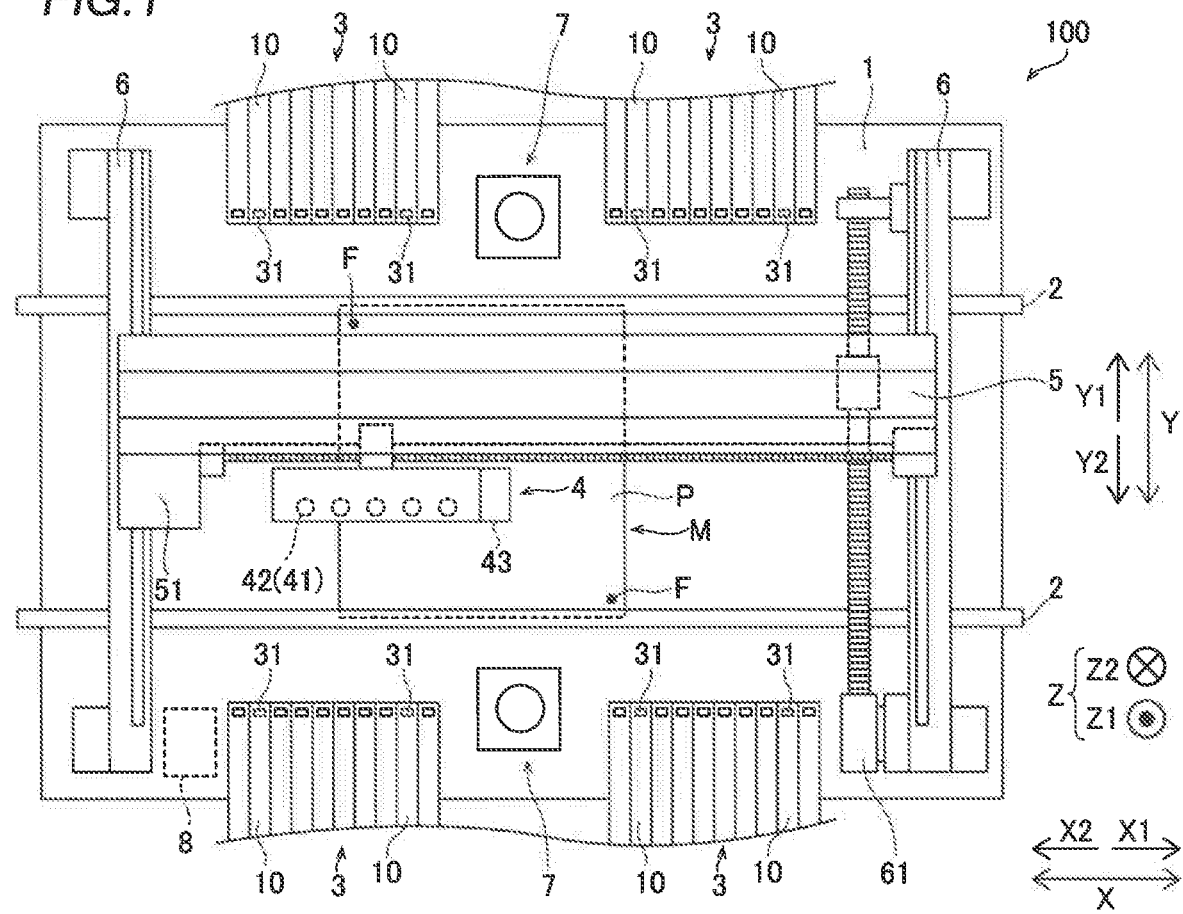
FIG. 1 is diagram showing the overall structure of a component mounting device according to an embodiment of the present disclosure.

As shown in FIG. 1, the component mounting device 100 is a component mounting device configured to convey a substrate P in an X direction by a pair of conveyors 2 and to mount components 31 on the substrate P at a mounting operation position M.

The component mounting device 100 includes a base 1, the pair of conveyors 2, component feeders 3, a head unit 4, a support 5, a pair of rails 6, component recognition imagers 7, and a controller 8.

The pair of conveyors 2 are installed on the base 1 and are configured to convey the substrate P in the X direction. In addition, the pair of conveyors 2 include a holding mechanism that holds the substrate P being conveyed in a stopped state at the mounting operation position M. Moreover, an interval between the pair of conveyors 2 in a Y direction can be adjusted according to the dimensions of the substrate P.

The component feeders 3 are arranged outside (Y1 and Y2 sides) of the pair of conveyors 2. A plurality of component supply devices 10 are arranged in the component feeders 3. The plurality of component supply devices 10 of the component feeders 3 are configured to feed the components 31 to mounting heads 42 described below.

Figure 2:
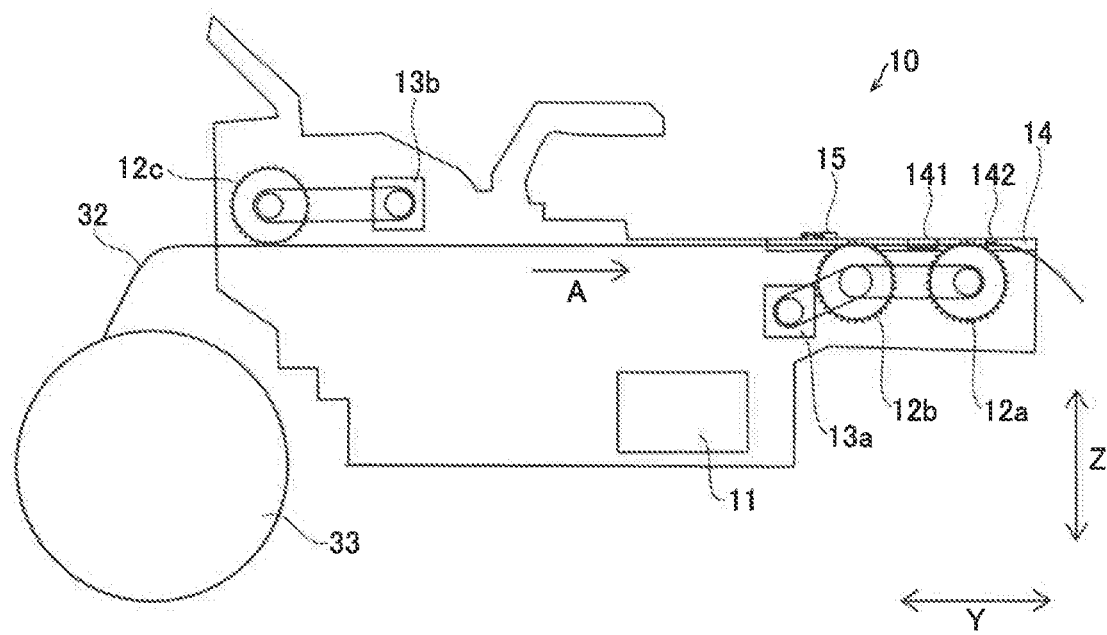
FIG. 2 is diagram schematically showing a component supply device according to the embodiment of the present disclosure.

As shown in FIG. 2, the component supply devices 10 hold reels 33 on which tapes 32 that hold a plurality of components 31 at a predetermined interval are wound. That is, the component supply devices 10 include tape feeders. The component supply devices 10 are configured to supply the components 31 from the tips of the component supply devices 10 in the Y direction by rotating the reels 33 to feed the tapes 32 that hold the components 31. The components 31 include electronic components such as ICs, transistors, capacitors, and resistors. The component supply devices 10 are described in detail below.

As shown in FIG. 1, the head unit 4 is arranged above the pair of conveyors 2 and the component feeders 3, and includes a plurality of (five) mounting heads 42 including nozzles 41 attached to their lower ends and a substrate recognition camera 43.

The mounting heads 42 are configured to mount the components 31 supplied from the component supply devices 10 on the substrate P. Specifically, the mounting heads 42 are configured to suction the components 31 supplied by the component feeders 3 and to mount the suctioned components 31 on the substrate P arranged at the mounting operation position M. The mounting heads 42 are movable up and down (movable in a Z direction). Furthermore, the mounting heads 42 are configured to suction and hold the components 31 supplied from the component supply devices 10 by a negative pressure generated at the tips of the nozzles 41 by a negative pressure generator (not shown) and to mount the components 31 at mounting positions on the substrate P.

The substrate recognition camera 43 is configured to image fiducial marks F of the substrate P in order to recognize the position and the orientation of the substrate P. The positions of the fiducial marks F are imaged and recognized such that the mounting positions of the components 31 on the substrate P can be accurately acquired.

The support 5 includes a motor 51. The support 5 is configured to move the head unit 4 in the X direction along the support 5 by driving the motor 51. Opposite ends of the support 5 are supported by the pair of rails 6.

The pair of rails 6 are fixed on the base 1. A rail 16 on the X1 side includes a motor 61. The rails 6 are configured to move the support 5 in the Y direction orthogonal to the X direction along the pair of rails 6 by driving the motor 61. The head unit 4 is movable in the X direction along the support 5, and the support 5 is movable in the Y direction along the rails 6 such that the head unit 4 is movable in a horizontal direction (XY direction).

The component recognition imagers 7 are fixed on the upper surface of the base 1. The component recognition imagers 7 are arranged outside (Y1 and Y2 sides) of the pair of conveyors 2. The component recognition imagers 7 are configured to image the components 31 suctioned by the nozzles 41 of the mounting heads 42 from below (Z2 side) in order to recognize the suction states (suction orientations) of the components 31 prior to mounting of the components 31. Thus, the suction states of the components 31 suctioned by the nozzles 41 of the mounting heads 42 can be acquired by the controller 8.

The controller 8 includes a CPU and a memory, and is configured to control the overall operation of the component mounting device 100 such as the substrate P conveying operation performed by the pair of conveyors 2, the mounting operation performed by the head unit 4, and the imaging operations performed by the component recognition imagers 7 and the substrate recognition camera 43. Moreover, the controller 8 is configured to be able to communicate with a controller 11 (see FIG. 2) of each of the component supply devices 10. The controller 8 is configured to control the mounting operation in cooperation with the controller 11 of each of the plurality of component supply devices 10.

(Structure of Component Supply Device)

The structure of each of the component supply devices 10 according to the embodiment of the present disclosure is now described with reference to FIGS. 2 to 10.

As shown in FIG. 2, the component supply device 10 includes the controller 11, sprockets 12a, 12b, and 12c including tape feeding teeth at equal intervals at their peripheral edges, motors 13a and 13b, a tape pressing member 14, and a press 15. The tape pressing member 14 includes an opener 141 and a component extraction position 142. The component supply device 10 is a feeder that can automatically load the tape 32.

Figure 3:
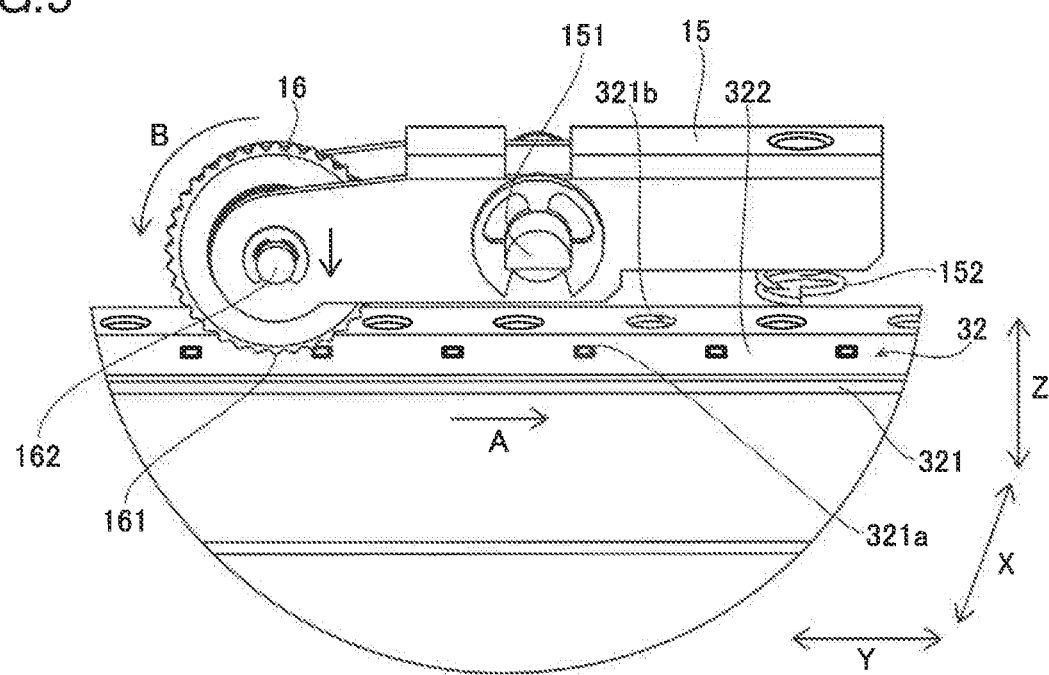
FIG. 3 is a perspective view showing a press according to the embodiment of the present disclosure.

The tape 32 includes a carrier tape 321 and a cover tape 322, as shown in FIG. 3. The carrier tape 321 includes storages 321a configured to store the components 31 and engagement holes 321b that engage with the sprockets 12a to 12c. The storages 321a each have a space larger than the size of a component 31. The upper sides of the storages 321a are covered with the cover tape 322. Thus, it is possible to prevent the components 31 from coming out of the storages 321a before component supply. At the time of component supply, the cover tape 322 is cut open such that the upper sides of the storages 321a are exposed. Thus, at the component extraction position 142, the components 31 can be extracted from the storages 321a by the mounting heads 42. A plurality of engagement holes 321b are arranged at a certain interval. Furthermore, the engagement holes 321b are arranged at predetermined relative positions with respect to the storages 321a.

The controller 11 is configured to control driving of the component supply devices 10. Specifically, the controller 11 is configured to control driving of the motors 13a and 13b to control the tape 32 feeding operation. The controller 11 includes a substrate including a control circuit. The controller 11 is configured to control the tape 32 feeding operation based on the tape 32 detection result by a sensor (not shown) provided in the component supply device 10.

The sprockets 12a and 12b are driven in conjunction with each other by the motor 13a. The sprocket 12c is driven by the motor 13b. The sprockets 12a, 12b, and 12c and the motors 13a and 13b constitute a tape feeder configured to feed the tape 32. The sprockets 12a, 12b, and 12c are configured to engage with the engagement holes 321b of the tape 32 to feed the tape 32 in a tape feed direction A.

The sprocket 12a is provided downstream of the opener 141 in the tape feed direction A. The sprocket 12b is provided upstream of the opener 141 and downstream of the press 15 in the tape feed direction A. The sprocket 12c is provided upstream of the press 15 in the tape feed direction A. The sprocket 12c is provided on the tape 32 entrance side of the component supply device 10.

The sprockets 12a and 12b are connected to each other by a belt and are rotated synchronously. The sprockets 12a and 12b are provided below a conveyance path for the tape 32. The sprocket 12c is provided above the conveyance path for the tape 32. Driving of the motors 13a and 13b is controlled by the controller 11, and the motors 13a and 13b are driven. The amounts of rotation of the motors 13a and 13b are set to minimum values. Thus, the minimum pitch for feeding the tape 32 is set.

The tape pressing member 14 is configured to press the tape 32 from above and to guide the tape 32 along the tape feed direction A. Furthermore, the tape pressing member 14 is arranged in a downstream region including the component extraction position 142 in the tape feed direction A. The size of the conveyance path for the tape 32 in an upward-downward direction can be minimized by the tape pressing member 14, and thus in the downstream region in the tape feed direction A, misalignment of the tape 32 in the upward-downward direction can be significantly reduced or prevented.

Figure 9:
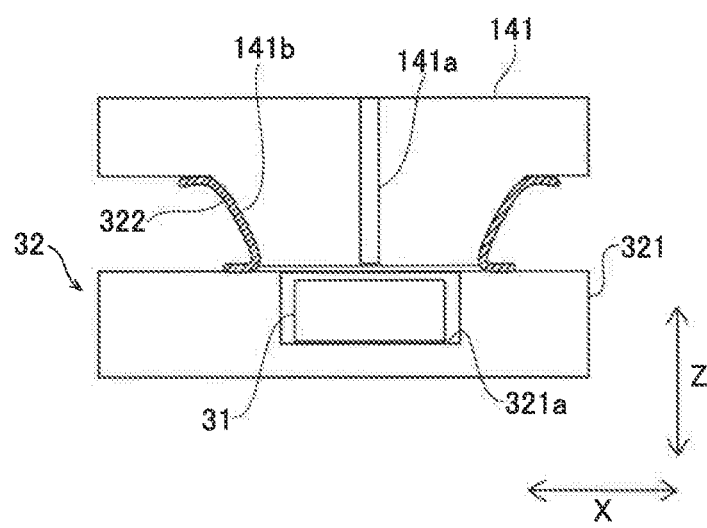
FIG. 9 is a diagram schematically showing an opener according to the embodiment of the present disclosure.

The opener 141 is configured to release covering of the storages 321a with the cover tape 322 and to open the upper sides of the storages 321a. As shown in FIG. 9, the opener 141 includes a cutter 141a and a cover tape guide 141b. The cutter 141a is configured to insert its cutting edge between the carrier tape 321 and the cover tape 322 to cut the cover tape 322. That is, the cutter 141a is configured to sequentially cut open the cover tape 322 as the tape 32 moves. The cover tape guide 141b is configured to press and spread the cut open cover tape 322 to both sides in the X direction. That is, the cover tape guide 141b is configured to sequentially open and spread the cover tape 322 in a width direction (X direction) as the tape 32 moves.

The component extraction position 142 is provided at a downstream portion of the tape pressing member 14 in the tape feed direction A. Specifically, the component extraction position 142 is provided downstream of the opener 141 in the tape feed direction A. The component extraction position 142 includes a rectangular hole that penetrates in the upward-downward direction (Z direction). Thus, the upper sides of the components 31 stored in the storages 321a are opened, and the components 31 can be extracted by the mounting heads 42.

The press 15 is provided on the tape pressing member 14. As shown in FIG. 3, the press 15 is provided with a roller 16. The press 15 includes a rotation shaft 151 and an urging member 152. The roller 16 includes protrusions 161 and a rotating shaft 162. That is, the press 15 includes the columnar protrusions 161 that press the upper surfaces of portions of the cover tape 322 that cover the storages 321a. Specifically, the press 15 includes a plurality of columnar protrusions 161. As shown in FIG. 2, the press 15 is arranged upstream of the opener 141 in the tape feed direction A. Furthermore, the press 15 is arranged upstream of the component extraction position 142, at which the components 31 are extracted from the storages 321a, in the tape feed direction A.

As shown in FIG. 3, the press 15 is configured to be rotatable about the rotation shaft 151 having a rotation axis in a direction (X direction) substantially parallel to the width direction of the tape 32. The urging member 152 urges the press 15 such that the press 15 rotates and urges the roller 16 downward. Thus, the protrusions 161 located at a lower portion of the roller 16 are urged downward. That is, the urging member 152 is configured to urge the protrusions 161 toward the cover tape 322. The urging member 152 includes a spring. The urging member 152 is configured to urge the protrusions 161 by the elastic force of the spring. The pressing force of the protrusions 161 is about several N to several tens N, for example. The protrusions 161 press the cover tape 322 downward by about several tens μm to several mm, for example.

Figure 4:
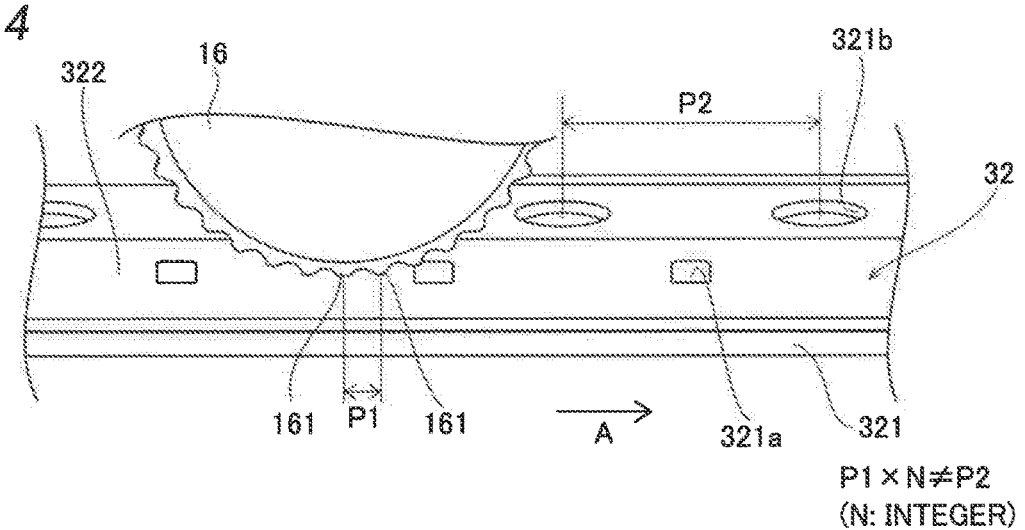
FIG. 4 is a diagram for illustrating an interval between a plurality of protrusions according to the embodiment of the present disclosure.

The protrusions 161 are configured to press the upper surfaces of the portions of the cover tape 322 that cover the storages 321a. Specifically, the plurality of protrusions 161 are circumferentially arranged on the outer periphery of the roller 16. The roller 16 is configured to contact the cover tape 322 from above and rotate along the tape feed direction A. The roller 16 is configured to be rotatable about the rotating shaft 162 having a rotating axis in the direction (X direction) substantially parallel to the width direction of the tape 32. The roller 16 is configured to rotate following movement of the tape 32. That is, the roller 16 is configured to rotate in a B direction when the tape 32 moves in an A direction. As shown in FIG. 4, the plurality of protrusions 161 are circumferentially arranged on the outer periphery of the roller 16 at an interval P1 smaller than the minimum pitch P2 for feeding the tape 32 by the tape feeder. Furthermore, the plurality of protrusions 161 are circumferentially arranged on the outer periphery of the roller 16 at an interval equal to or less than an interval between the teeth of each of the sprockets 12a and 12b.

The plurality of protrusions 161 are circumferentially spaced apart on the outer periphery of the roller 16 such that a value obtained by multiplying the interval P1 between the adjacent protrusions 161 by an integer does not match the minimum pitch value for feeding the tape 32 by the tape feeder. That is, a formula of P1×N≠P2 (where N is an integer) is satisfied. Furthermore, the plurality of protrusions 161 are circumferentially spaced apart on the outer periphery of the roller 16 such that a value obtained by multiplying a pitch length by an integer does not match the pitch of the storages 321a. The pitch of the storages 321a of the tape 32 is determined according to predetermined standards.

Figure 5:
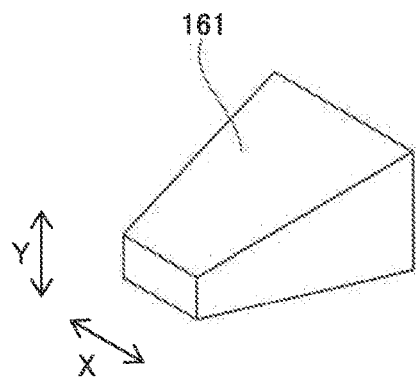
FIG. 5 is a perspective view showing a first example of a protrusion according to the embodiment of the present disclosure.
Figure 6:
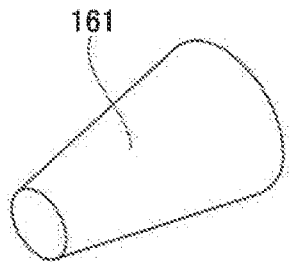
FIG. 6 is a perspective view showing a second example of the protrusion according to the embodiment of the present disclosure.
Figure 7:
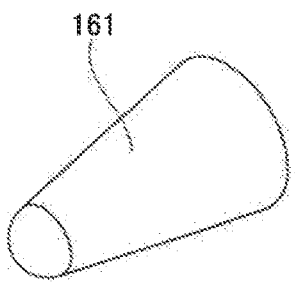
FIG. 7 is a perspective view showing a third example of the protrusion according to the embodiment of the present disclosure.

As shown in FIGS. 5 to 7, the columnar protrusions 161 each have a tapered shape. In an example of FIG. 5, the protrusion 161 has a rectangular flat surface at its tip. In the example of FIG. 5, the tip of the protrusion 161 is formed with a length in the width direction (X direction) of the tape 32 larger than a length in the feed direction (Y direction) of the tape 32. In an example of FIG. 6, the protrusion 161 has a circular flat surface at its tip. In an example of FIG. 7, the protrusion 161 has a hemispherical curved surface at its tip. The protrusion 161 is preferably shaped such that its tip is tapered but not sharp. That is, as a member that presses the cover tape 322 is thinner, sticking of the component 31 is more easily removed.

Figure 8:
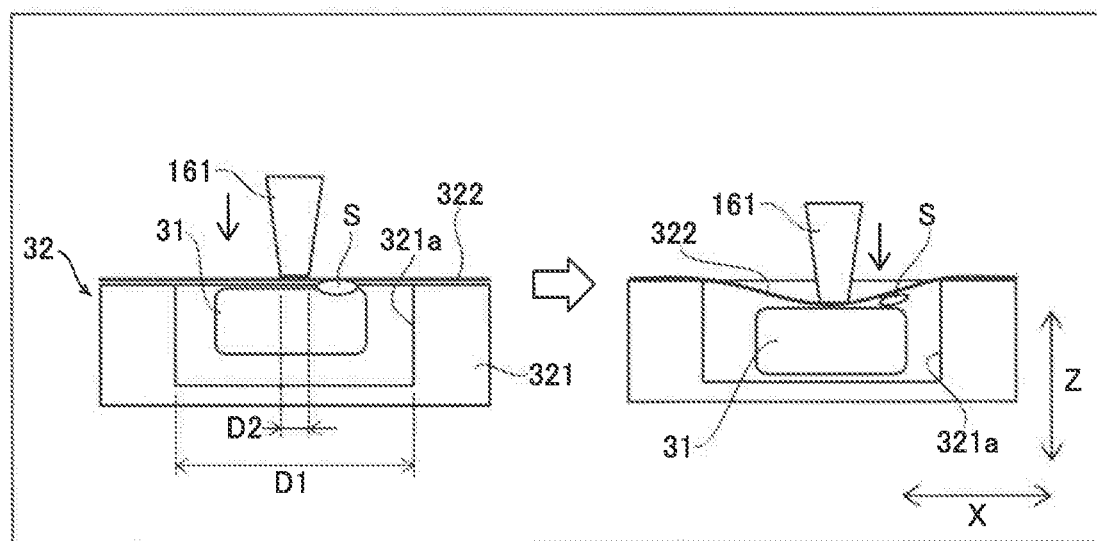
FIG. 8 is a diagram for illustrating pressing of the cover tape by the protrusions according to the embodiment of the present disclosure.

As shown in FIG. 8, the columnar protrusion 161 has a size in each of a direction (Y direction) in which the tape 32 is fed and the width direction (X direction) of the tape 32 that is smaller than the size of the storage 321a in the corresponding direction. For example, the length of the storage 321a in the X direction (Y direction) is D1, and the length of the tip of the protrusion 161 in the X direction (Y direction) is D2 that is smaller than D1. Preferably, the columnar protrusion 161 has a size in at least one of the X direction or the Y direction that is less than half the size of the storage 321a in the corresponding direction. The size of the tip of the columnar protrusion 161 is reduced such that the cover tape 322 can be deformed so as to have few flat portions, and thus the effect of removing sticking of the component 31 is enhanced. On the other hand, when D2 is equal to or greater than D1, the cover tape 322 cannot be deformed by the tip of the protrusion 161, or even when the cover tape 322 is deformed, the amount of deformation is small. The X direction is an example of a "second direction" in the claims, and the Y direction is an example of a "first direction" in the claims.

As shown in FIG. 8, the component 31 may stick to the cover tape 322 due to a small adhesive S having viscosity between the cover tape 322 and the component 31, for example. In this case, the effect of removing the adhesive S from the component 31 or the cover tape 322 can be improved by reducing the size of the tip of the protrusion 161. Thus, sticking of the component 31 to the cover tape 322 can be effectively removed.

Figure 10:
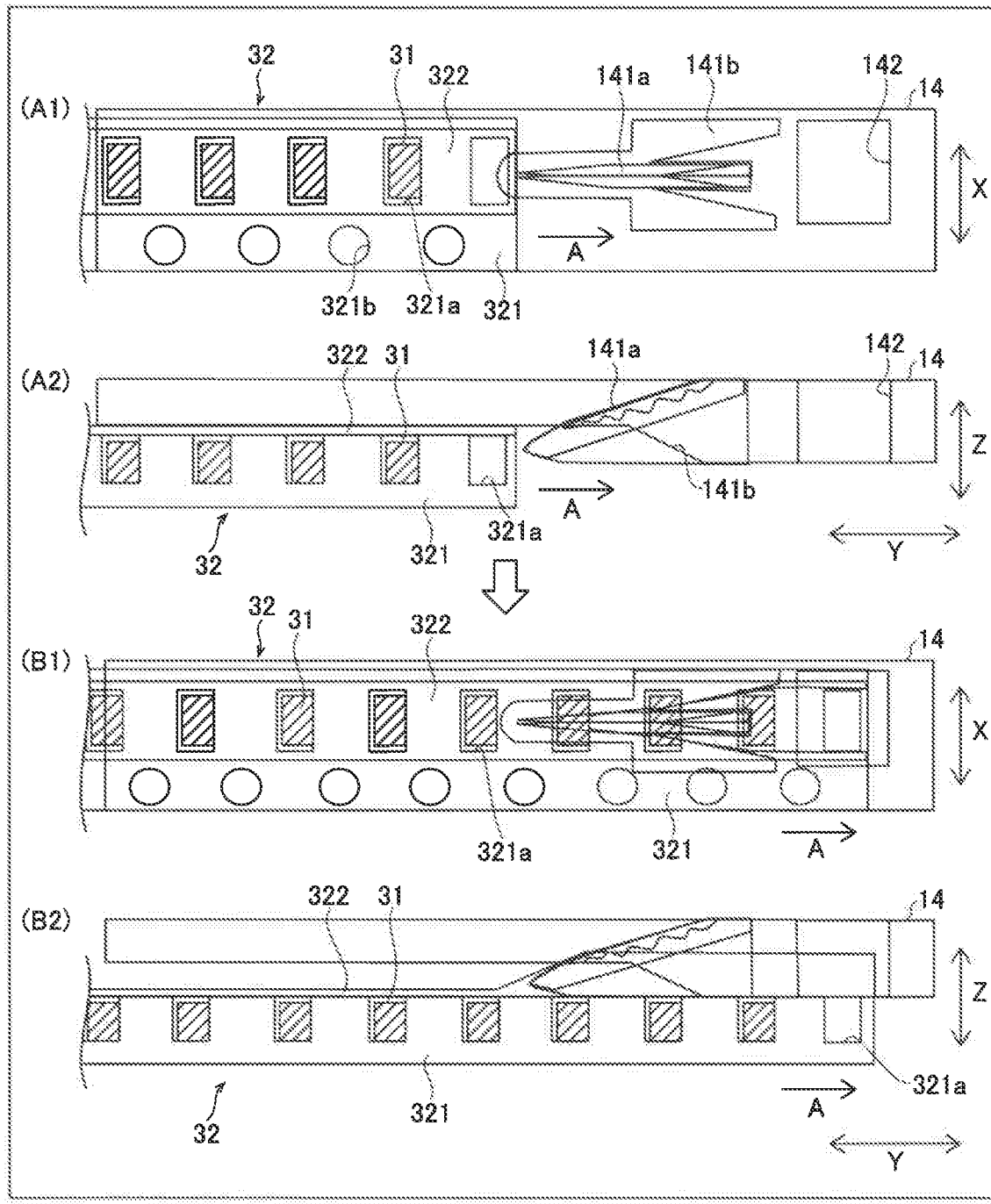
FIG. 10 is a diagram for illustrating opening of the cover tape by the opener according to the embodiment of the present disclosure.

After the tape 32 is fed by the tape feeder and the upper surface of the cover tape 322 is pressed by the protrusions 161, the cover tape 322 is cut open by the opener 141, as shown in FIG. 10. Specifically, as shown in view (A1) and view (A2) of FIG. 10, when the tape 32 reaches the tip of the cutter 141a of the opener 141, the cutting edge of the cutter 141a is inserted between the carrier tape 321 and the cover tape 322. Then, as shown in view (B1) and view (B2) of FIG. 10, when the tape 32 is further fed, the cover tape 322 is cut by the cutter 141a, and the cut cover tape 322 is opened outward in the width direction by the cover tape guide 141b.

Advantageous Effects of Embodiment

According to this embodiment, the following advantageous effects are achieved.

According to this embodiment, as described above, the press 15 including the columnar protrusions 161 configured to press the upper surfaces of the portions of the cover tape 322 that cover the storages 321a is provided. Accordingly, even when the component 31 adheres to the cover tape 322, the cover tape 322 is pressed from above by the protrusions 161 such that the component 31 can be separated from the cover tape 322 and stored in the storage 321a. Consequently, when covering with the cover tape 322 is released, it is possible to significantly reduce or prevent component 31 jumping out of the storage 321a and contact between the opening portion 141 and the component 31. Thus, the components 31 can be reliably supplied while adhesion of the components 31 to the cover tape 322 is significantly reduced or prevented.

According to this embodiment, as described above, the columnar protrusions 161 each have a size in each of the direction (Y direction) in which the tape 32 is fed and the width direction (X direction) of the tape 32 that is smaller than the size of the storage 321a in the corresponding direction. Accordingly, the protrusions 161 can be inserted into the storages 321a via the cover tape 322, and thus the cover tape 322 can be deformed in a concave shape toward the bottom surfaces of the storages 321a by the protrusions 161. Thus, when the components 31 adhere to the cover tape 322, the components 31 that have adhered can be easily separated from the cover tape 322.

According to this embodiment, as described above, the columnar protrusions 161 each have a size in at least one of the X direction or the Y direction that is less than half the size of the storage 321a in the corresponding direction. Accordingly, the protrusions 161 can be easily inserted into the storages 321a via the cover tape 322, and thus the cover tape 322 can be easily deformed in a concave shape toward the bottom surfaces of the storages 321a by the protrusions 161.

According to this embodiment, as described above, the opener 141 configured to release covering with the cover tape 322 and open the upper sides of the storages 321a is provided, and the press 15 is arranged upstream of the opener 141 in the direction in which the tape 32 is fed. Accordingly, the components 31 that have adhered to the cover tape 322 can be separated upstream of a position at which covering with the cover tape 322 is released by the opener 141, and thus interference between the opener 141 and the components 31 can be effectively significantly reduced or prevented.

According to this embodiment, as described above, the press 15 is arranged upstream of the component extraction position 142, at which the components 31 are extracted from the storages 321a, in the direction in which the tape 32 is fed. Accordingly, the components 31 can be reliably stored in the storages 321a upstream of the component extraction position 142, and thus the components 31 can be more reliably supplied.

According to this embodiment, as described above, the plurality of protrusions 161 are circumferentially arranged on the outer periphery of the roller 16. Accordingly, the resistance to tape feeding caused by pressing of the press 15 against the cover tape 322 can be reduced by rotation of the roller 16, and thus the tape 32 can be fed smoothly.

According to this embodiment, as described above, the plurality of protrusions 161 are circumferentially arranged on the outer periphery of the roller 16 at the interval equal to or less than the minimum pitch for feeding the tape 32 by the tape feeder. Accordingly, the interval between the plurality of protrusions 161 can be reduced, and thus the protrusions 161 can be applied with high probability to portions of the cover tape 322 corresponding to the storages 321a.

According to this embodiment, as described above, the plurality of protrusions 161 are circumferentially spaced apart on the outer periphery of the roller 16 such that the value obtained by multiplying the interval between the adjacent protrusions 161 by the integer does not match the minimum pitch value for feeding the tape 32 by the tape feeder. Accordingly, a cycle of an interval between the storages 321a and a cycle of the interval between the plurality of protrusions 161 can be shifted from each other, and thus even when one protrusion 161 misses the storage 321a, another protrusion 161 can be aligned with the storage 321a. Thus, the protrusions 161 can be applied with higher probability to the portions of the cover tape 322 corresponding to the storages 321a.

According to this embodiment, as described above, the columnar protrusions 161 are tapered. Accordingly, the mechanical strength of base portions of the protrusions 161 can be increased, and the tips of the protrusions 161 can be more easily inserted into the storages 321a via the cover tape 322.

According to this embodiment, as described above, the urging member 152 configured to urge the protrusions 161 toward the cover tape 322 is provided. Accordingly, the protrusions 161 can be easily pressed against the cover tape 322.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

Figure 11:
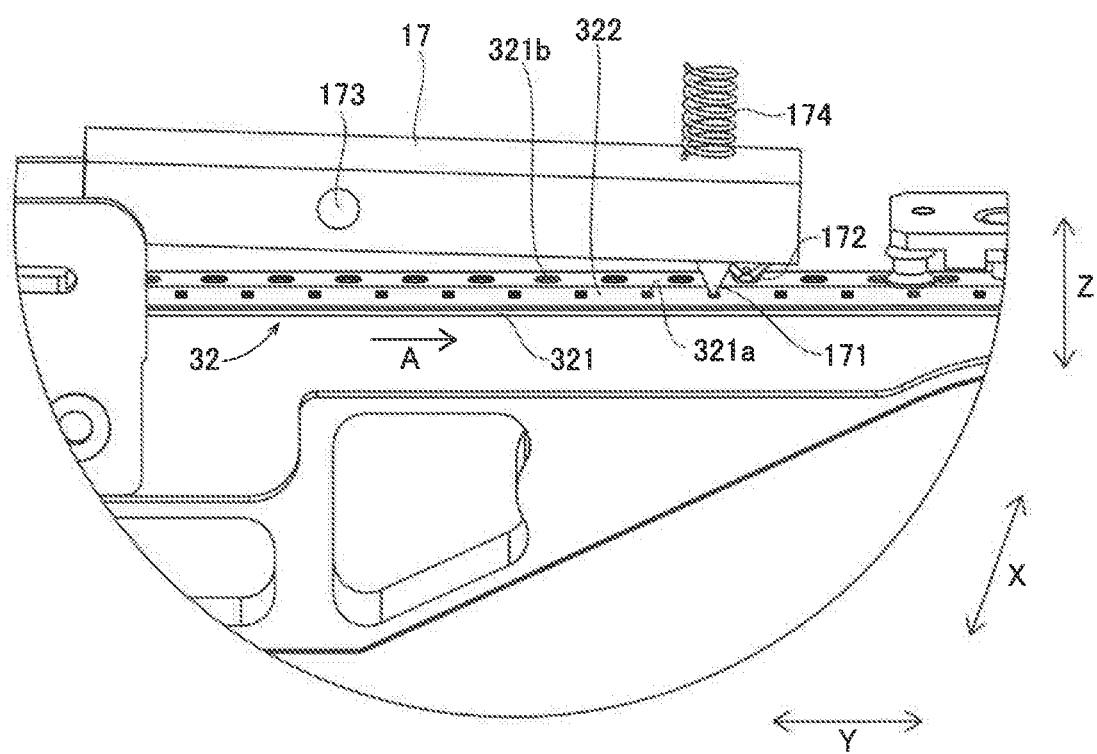
FIG. 11 is a perspective view showing a press according to a modified example of the embodiment of the present disclosure.

For example, while the example in which the protrusions are provided on the roller has been shown in the aforementioned embodiment, the present disclosure is not restricted to this. In the present disclosure, as in a modified example shown in FIG. 11, a protrusion 171 may be provided on a bar-shaped member. That is, a press 17 may include the protrusion 171, a roller 172, a rotation shaft 173, and an urging member 174. The protrusion 171 is configured to press the upper surfaces of portions of a cover tape 322 that cover storages 321a. Furthermore, the protrusion 171 has a columnar shape. The protrusion 171 is tapered toward its tip (lower end). The roller 172 is arranged at a predetermined interval in the width direction (X direction) of a tape 32 from the protrusion 171. The protrusion 171 and the roller 172 are arranged such that a distance therebetween in a tape feed direction (Y direction) is substantially equal to a distance between an engagement hole 321b and the storage 321a in the Y direction. The roller 172 is configured to be rotatable about a rotating axis that extends in an X direction. The roller 172 is configured to rotate following movement of the tape 32. When the roller 172 falls into the engagement hole 321b, the protrusion 171 presses the upper surface of the cover tape 322. The press 17 is configured to be rotatable about the rotation shaft 173 having a rotation axis in a direction (X direction) substantially parallel to the width direction of the tape 32. The urging member 174 urges the press 17 such that the press 17 rotates and urges the protrusion 171 downward.

While the example in which the plurality of protrusions are provided in one component supply device has been shown in the aforementioned embodiment, the present disclosure is not restricted to this. In the present disclosure, one protrusion may be provided in one component supply device.

While the example in which the component supply device performs automatic loading has been shown in the aforementioned embodiment, the present disclosure is not restricted to this. In the present disclosure, the component supply device may not perform automatic loading. Even in this case, sticking of the component to the cover tape can be significantly reduced or prevented, and thus the component can be reliably supplied.

While the example in which the urging member includes a spring has been shown in the aforementioned embodiment, the present disclosure is not restricted to this. In the present disclosure, the urging member may be other than a spring. Furthermore, the protrusions may be urged downward by gravity without providing the urging member.

While the example in which the cover tape is cut open by the opener has been shown in the aforementioned embodiment, the present disclosure is not restricted to this. In the present disclosure, the cover tape may be peeled off from the carrier tape by the opener such that the upper sides of the storages are opened.

While the example in which the component supply device is arranged at a component supply position has been shown in the aforementioned embodiment, the present disclosure is not restricted to this. In the present disclosure, in addition to the component supply device, a tray or the like on which components are placed may be arranged at the component supply position.

What is claimed is:

1. A component supply device comprising:
a tape feeder configured to feed a tape including a storage configured to store a component and a cover tape configured to cover an upper side of the storage;
a press including a columnar protrusion which is smaller than a size of the storage in plan view and is configured to press an upper surface of a portion of the cover tape that covers the storage such that the columnar protrusion presses the cover tape to below a top edge of the storage; and
an opener configured to release covering with the cover tape and open the upper side of the storage; wherein
the press is arranged upstream of the opener in a direction in which the tape is fed.

2. The component supply device according to claim 1, wherein
the columnar protrusion has a first size in a first direction in which the tape is fed and a second size in a second direction, which is orthogonal to the first direction and is horizontal, the first size being smaller than a first corresponding size of the storage in a first corresponding direction that corresponds to the first direction, and the second size being smaller than a second corresponding size of the storage in a second corresponding direction that corresponds to the second direction.

3. The component supply device according to claim 2, wherein at least one of the following:
the first size is less than half of the first corresponding size of the storage; and
the second size is less than half of the second corresponding size of the storage.

4. The component supply device according to claim 3, wherein
the press is arranged upstream of a component extraction position, at which the component is extracted from the storage, in the direction in which the tape is fed.

5. The component supply device according to claim 3, further comprising
a roller configured to contact the cover tape from above and rotate along the direction in which the tape is fed; wherein
the press includes a plurality of protrusions; and
the plurality of protrusions are circumferentially arranged on an outer periphery of the roller.

6. The component supply device according to claim 3, wherein the columnar protrusion is tapered.

7. The component supply device according to claim 3, further comprising
an urging member configured to urge the protrusion toward the cover tape.

8. The component supply device according to claim 2, wherein
the press is arranged upstream of a component extraction position, at which the component is extracted from the storage, in the direction in which the tape is fed.

9. The component supply device according to claim 2, further comprising
a roller configured to contact the cover tape from above and rotate along the direction in which the tape is fed; wherein
the press includes a plurality of protrusions; and
the plurality of protrusions are circumferentially arranged on an outer periphery of the roller.

10. The component supply device according to claim 2, wherein the columnar protrusion is tapered.

11. The component supply device according to claim 2, further comprising
an urging member configured to urge the protrusion toward the cover tape.

12. The component supply device according to claim 1, wherein
the press is arranged upstream of a component extraction position, at which the component is extracted from the storage, in the direction in which the tape is fed.

13. The component supply device according to claim 12, wherein the columnar protrusion is tapered.

14. The component supply device according to claim 1, further comprising
a roller configured to contact the cover tape from above and rotate along the direction in which the tape is fed; wherein
the press includes a plurality of protrusions; and
the plurality of protrusions are circumferentially arranged on an outer periphery of the roller.

15. The component supply device according to claim 14, wherein
the plurality of protrusions are circumferentially arranged on the outer periphery of the roller at an interval that is equal to or less than a minimum pitch to feed the tape by the tape feeder.

16. The component supply device according to claim 15, wherein
the plurality of protrusions are circumferentially spaced apart on the outer periphery of the roller such that a value obtained by multiplying an interval between adjacent protrusions by an integer does not match a value of the minimum pitch value to feed the tape by the tape feeder.

17. The component supply device according to claim 14, wherein
the plurality of protrusions are circumferentially spaced apart on the outer periphery of the roller such that a value obtained by multiplying an interval between adjacent protrusions by an integer does not match a value of the minimum pitch value to feed the tape by the tape feeder.

18. The component supply device according to claim 1, wherein the columnar protrusion is tapered.

19. The component supply device according to claim 1, further comprising an urging member configured to urge the protrusion toward the cover tape.

20. A component mounting device comprising:

a component supply device; and a mounting head configured to mount, on a substrate, a component supplied from the component supply device; wherein the component supply device includes:

a tape feeder configured to feed a tape including a storage configured to store the component and a cover tape configured to cover an upper side of the storage;

a press including a columnar protrusion which is smaller than a size of the storage in plan view and is configured to press an upper surface of a portion of the cover tape that covers the storage such that the columnar protrusion presses the cover tape to below a top edge of the storage; and an opener configured to release covering with the cover tape and open the upper side of the storage; and the press is arranged upstream of the opener in a direction in which the tape is fed.

\* \* \* \* \*